(12) United States Patent
Khitun et al.

(10) Patent No.: US 9,300,251 B2
(45) Date of Patent: Mar. 29, 2016

(54) FREQUENCY MIXER HAVING FERROMAGNETIC FILM

(75) Inventors: Alexander Khitun, Los Angeles, CA (US); Igor V. Roshchin, San Diego, CA (US); Kosmas Galatsis, Torrance, CA (US); Mingqiang Bao, Los Angeles, CA (US); Kang L. Wang, Santa Monica, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 2459 days.

(21) Appl. No.: 12/049,040

(22) Filed: Mar. 14, 2008

(65) Prior Publication Data

US 2008/0224740 A1    Sep. 18, 2008

Related U.S. Application Data

(60) Provisional application No. 60/895,391, filed on Mar. 16, 2007.

(51) Int. Cl.
*H04B 1/28* (2006.01)
*H03D 9/00* (2006.01)

(52) U.S. Cl.
CPC ........................ *H03D 9/00* (2013.01)

(58) Field of Classification Search
CPC ........................................ H03D 9/00
USPC ................................. 455/333; 438/3; 257/295
See application file for complete search history.

(56) References Cited

U.S. PATENT DOCUMENTS

| | | | | |
|---|---|---|---|---|
| 3,803,623 A * | 4/1974 | Charlot, Jr. | | 343/846 |
| 4,063,246 A * | 12/1977 | Greiser | | 343/700 MS |
| 5,327,148 A * | 7/1994 | How et al. | | 343/700 MS |
| 6,169,688 B1 * | 1/2001 | Noguchi | | 365/171 |
| 7,263,343 B2 * | 8/2007 | Mitsunaka et al. | | 455/292 |
| 7,375,639 B2 * | 5/2008 | Dixon et al. | | 340/572.8 |
| 7,376,403 B1 * | 5/2008 | Wanke et al. | | 455/189.1 |
| 2005/0207071 A1 * | 9/2005 | Sato et al. | | 360/324.2 |
| 2006/0044703 A1 * | 3/2006 | Inomata et al. | | 360/324.1 |
| 2007/0042730 A1 * | 2/2007 | Kim et al. | | 455/132 |
| 2008/0013755 A1 * | 1/2008 | Marsili et al. | | 381/119 |
| 2008/0186237 A1 * | 8/2008 | Tanaka | | 343/700 MS |
| 2009/0015376 A1 * | 1/2009 | Xiang et al. | | 340/10.1 |

OTHER PUBLICATIONS

Alexander Khitun; King L. Wang, Superlattices and Microstructures 38(2005) 184-200.*

(Continued)

*Primary Examiner* — Yuwen Pan
*Assistant Examiner* — Fatuma Sherif
(74) *Attorney, Agent, or Firm* — Vista IP Law Group LLP

(57) ABSTRACT

A frequency conversion device, which may include a radiofrequency (RF) mixer device, includes a substrate and a ferromagnetic film disposed over a surface of the substrate. An insulator is disposed over the ferromagnetic film and at least one microstrip antenna is disposed over the insulator. The ferromagnetic film provides a non-linear response to the frequency conversion device. The frequency conversion device may be used for signal mixing and amplification. The frequency conversion device may also be used in data encryption applications.

20 Claims, 4 Drawing Sheets

(56) References Cited

OTHER PUBLICATIONS

Kalinikos, Boris A. et al. "Parametric Frequency Conversion with Amplification of a Weak Spin Wave in a Ferrite Film", IEEE Transactions on Magnetics, vol. 34, No. 4, pp. 1393-1395, Jul. 1998 (3 pages).

Oxley, Terry H. "50 Years Development of the Microwave Mixer for Heterodyne Reception", IEEE Transactions on Microwave Theory and Techniques, vol. 50, No. 3, pp. 867-876, Mar. 2002 (10 pages).

Siles, J.V. et al. "Schottky Diode-Based Mixers Design and Optimization at Millimetre and Submillimetre-wave Bands", 2005 European Microwave Conference, Oct. 2005 (4 pages).

Stamps, J. et al. "Synthesis of Active Microwave Mixers for Optimum Performance", Proceedings of the 33rd Symposium on Circuits and Systems, vol. 1, pp. 592-596, Aug. 1990 (5 pages).

\* cited by examiner

FREQUENCY MIXER HAVING FERROMAGNETIC FILM

REFERENCE TO RELATED APPLICATIONS

This Application claims priority to U.S. Provisional Patent Application No. 60/895,391 filed on Mar. 16, 2007. U.S. Patent Application No. 60/895,391 is incorporated by reference as if set forth fully herein.

FEDERALLY-SPONSORED RESEARCH AND DEVELOPMENT

This invention was made with government support under DE-FG03-87ER45332, awarded by the United States Department of Energy. The government has certain rights in the invention.

FIELD OF THE INVENTION

The field of the invention generally relates to frequency conversion devices and in particular, frequency mixer devices.

BACKGROUND OF THE INVENTION

A frequency mixer is one of the basic elements in many communication devices such as, for instance, mobile phones. Frequency mixers are used in frequency-to-frequency conversion and are critical components in modern radiofrequency (RF) systems. Generally, a frequency mixer converts RF power at one frequency into power at another, shifted frequency. This can make subsequent signal processing easier and inexpensive.

A fundamental reason for frequency conversion is to allow amplification of the received signal at a frequency other than the applied RF, or audio, frequency. For instance, a receiver may require as much as 140 decibels (dB) gain. However, it might not be possible to put more than 40 dB gain into the RF section of the receiver without risking instability and potential oscillations. Similarly, the gain of the audio portion of the receiver may be limited to 60 dB because of parasitic feedback paths and microphonics. The additional gain needed for a sensitive receiver is normally achieved in a mixed frequency (MF) section of the receiver.

FIG. 1 illustrates a schematic representation of an ideal mixer, which multiplies two input signals: RF input and LO input. RF input corresponds to the radiofrequency (RF) input to the mixer at a first frequency $f_1$ while LO input corresponds to the Local Oscillator input frequency $f_2$. The mixer multiplies the two input frequencies ($f_1$, $f_2$) and produces a mixed frequency (MF). Assuming that the two input frequencies ($f_1$, $f_2$) are sinusoids, the ideal mixer illustrated in FIG. 1 produces two output frequencies which include the sum ($f_1+f_2$) and difference ($f_1-f_2$) of the frequencies.

Currently, RF mixers are built using electronic devices such as diodes, field effect transistors (FETs), and bipolar transistors, which have non-linear I-V characteristics to provide the frequency conversion mechanism. Unfortunately, there are some downsides to current electronic-based mixer devices. First, these devices utilize power because of the electric current-based non-linear elements. Power consumption is increasingly important as commercial devices are made ever smaller and require longer operational use times. In addition, electronic devices may not be compatible with high frequency operations (e.g., those in the GHz or THz range) because of internal delays caused by the electronic components.

There thus is a need for alternative frequency conversion devices (e.g., RF mixers) to conventional electronic-based devices. Such a device should be scalable which can be made in a very small size using conventional semiconductor manufacturing processes. The device should be able to operate at high frequencies, including frequencies in the GHz and THz range. Power consumption should also be reduced to the extent possible.

SUMMARY

In one aspect of the invention, a frequency conversion device includes a substrate and a ferromagnetic film disposed over the surface of the substrate. An insulator is disposed over the ferromagnetic film. At least one microstrip antenna is disposed over the insulator. The frequency conversion device may be a RF mixer device. The substrate may be a semiconductor material such as silicon or quartz. The ferromagnetic film is one which exhibits non-linear characteristics. The ferromagnetic films may be formed from, for instance, nickel-iron (NiFe), cobalt-iron (CoFe), and cobalt-tantalum-zirconium (CoTaZr). The separation distance between the microstrip antenna and the upper surface of the ferromagnetic film may be between several or tens of nanometers or hundreds of nanometers. The frequency conversion device may have a single microstrip antenna or a plurality of antennas.

In another aspect of the invention, a frequency conversion device includes a substrate and a ferromagnetic film of first and second types disposed over a surface of the substrate. Additional types of ferromagnetic film may also be disposed over the surface of the substrate (e.g., third, fourth, etc.). An insulator is disposed over the ferromagnetic films. For each type of ferromagnetic film, a respective microstrip antenna is disposed on the insulator at a location above the respective ferromagnetic film type. In this regard, a single frequency conversion device may provide many different mixed frequencies given the different underlying ferromagnetic films underlying the insulator layer.

The frequency conversion device may be implemented in commercial communication devices such as mobile phones. Further, the frequency conversion device may be used in data encryption applications. For instance, different devices incorporating the frequency conversion aspect described herein may be configured to receive a first public RF input frequency. The second, LO input frequency, may be unique to each user and serve as a private key for his or her device. The LO input frequency may also be tunable or adjustable such that the private key may be altered or changed.

DETAILED DESCRIPTION OF THE ILLUSTRATED EMBODIMENTS

Figure 2:
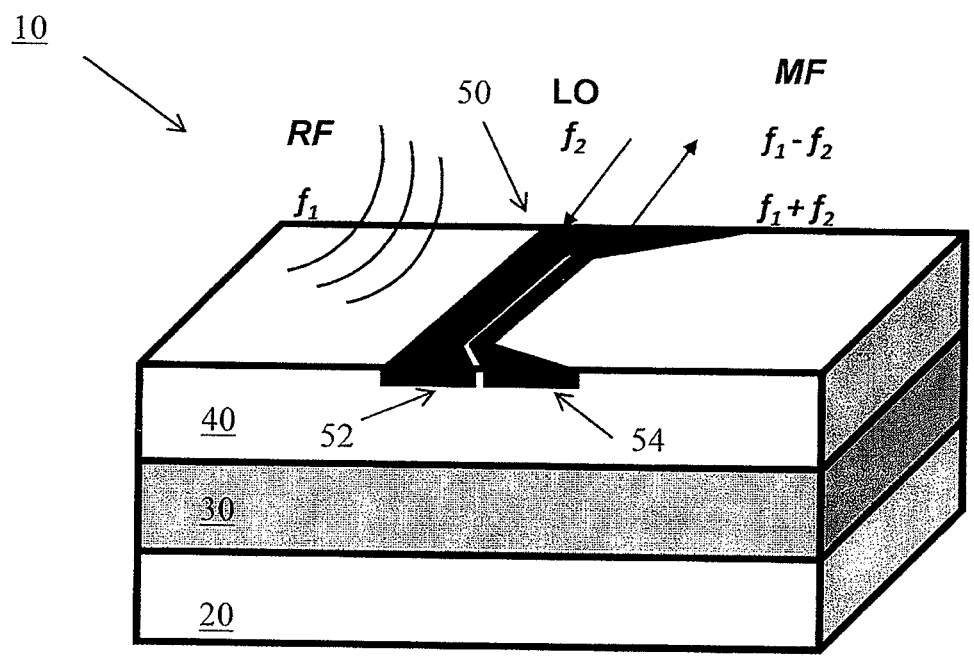
FIG. 2 illustrates a perspective schematic representation of a frequency conversion device according to one aspect of the invention.

FIG. 2 schematically illustrates a frequency conversion device 10 according to one aspect of the invention. The frequency conversion device 10 may include, for example, a frequency mixer device. The frequency conversion device 10 includes a substrate 20 which may be formed from a semiconductor material such as, for instance, silicon. While silicon is illustrated in FIG. 2 it should be understood that other semiconductor-based materials may also be used in the frequency conversion device 10. Quartz may also be used as the material for the substrate 20 in alternative embodiments.

As seen in FIG. 2, a ferromagnetic film 30 is located on a surface (e.g., upper surface) of the substrate 20. The ferromagnetic film 30 may be formed by directly depositing a ferromagnetic material on the surface of the substrate 20. For example, the ferromagnetic film 30 may be deposited using conventional sputtering or other deposition techniques generally used to deposit ferromagnetic materials. Any number of ferromagnetic materials may be used to form the ferromagnetic film 30. For example, exemplary ferromagnetic materials include nickel-iron (NiFe), cobalt-iron (CoFe), and cobalt-tantalum-zirconium (CoTaZr). The ferromagnetic materials may have any number of different stoichiometric ratios for the various elemental constituents. For example, a nickel-iron ferromagnetic film 30 may include $Ni_{18}Fe_{91}$. A cobalt-iron ferromagnetic film 30 may include $Co_{30}Fe_{70}$. It should be understood that these are only illustrative and other ratios beyond those expressly disclosed herein may also be used in accordance with the invention.

The ferromagnetic film 30 typically has a thickness on the order of several nanometers to hundreds of nanometers. The minimum thickness is limited by the paramagnetic limit (about 10 nm). The upper limit is limited by the skin depth of the electromagnetic radiation penetration inside the ferromagnetic film. The ferromagnetic film 30 may have a thickness that is less than (or about) several hundred nanometers (e.g., less than about 500 nm). A typical thickness of the ferromagnetic film 30 is on the order of about 100 nm.

Still referring to FIG. 2, an insulator 40 is disposed over the ferromagnetic film 30. The insulator 40 may include a dielectric material such as silicon dioxide although other insulative materials may also be used. The insulator 40 may be deposited over the ferromagnetic film 30 using conventional chemical-vapor deposition (CVD) processes known to those skilled in semiconductor processing techniques. The thickness of the insulator 40 may vary to place the microstrip antenna 50 (disclosed in detail below) either closer or further away from the ferromagnetic film 30. In some embodiments, the distance between the microstrip antenna 50 and the upper surface of the ferromagnetic film 30 is greater than about 10 nm. In other embodiments, the distance between the microstrip antenna 50 and the upper surface of the ferromagnetic film 30 may be tens or hundreds of nanometers (e.g., 500 nm). Generally, the distance should not be greater than a few multiples of the wavelength of incident RF energy on the device 10. A smaller distance between the microstrip antenna 50 and the upper surface of the ferromagnetic film 30 produces a higher output signal.

As seen in FIG. 2, a microstrip antenna 50 is positioned atop the insulator 40. The microstrip antenna 50 may include any type of microstrip antennas 50 generally used in RF applications. For instance, the microstrip antenna 50 may include an asymmetric coplanar stripline (ACSP) antenna 50. Generally, the microstrip antenna 50 includes a first conductor 52 and a second conductor 54 that are patterned atop the surface of the insulator 40. The first and second conductors 52, 54 may then be operatively coupled to off-board circuitry that applies the LO input frequency $f_2$ and also for frequency response analysis. These two conductors 52, 54 may interface with the off-board circuitry through, for instance, a coaxial connection (not shown). The conductors 52, 54 of the microstrip antenna 50 are generally formed from a metallic material such as, for instance, aluminum although other conductors may be used. The microstrip antenna 50 may be deposited on the upper surface of the insulator 40 using conventional lithography/masking techniques. FIG. 2 illustrates a single microstrip antenna 50 illustrated atop the insulator 40. In other embodiments, however, there may be a plurality of microstrip antennas 50 disposed on the insulator 40.

Figure 3:
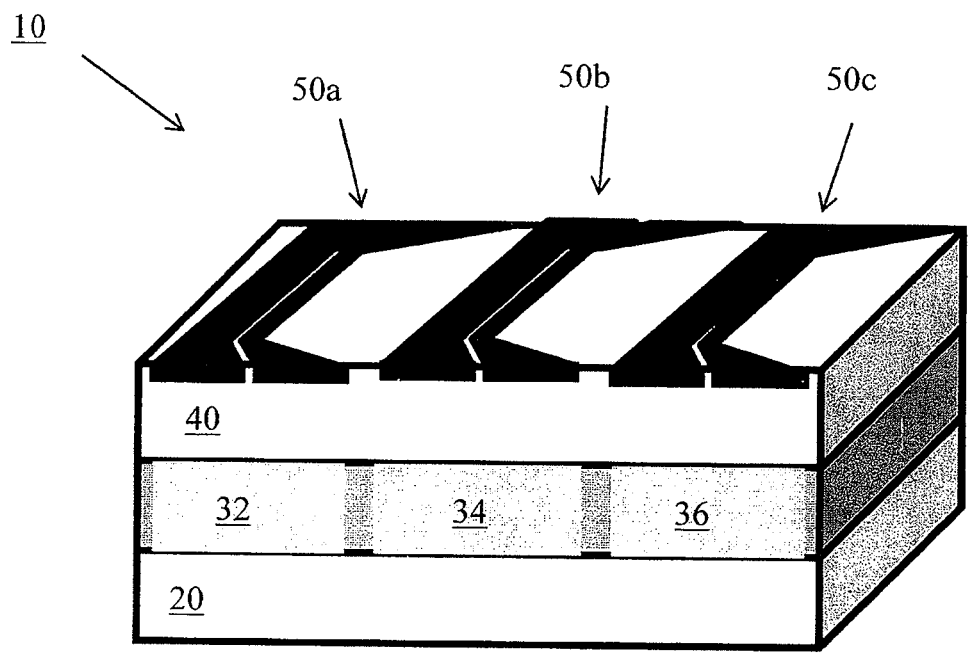
FIG. 3 illustrates a perspective schematic representation of a frequency conversion device according to another aspect of the invention.

FIG. 3 illustrates another embodiment of the invention. In FIG. 3, the ferromagnetic film 30 includes multiple segments or portions 32, 34, 36 with each portion being formed from a different ferromagnetic material. For example, a first film portion 32 may be formed from NiFe, while the second film portion 34 may be formed from CoFe, and the third film portion 36 may be formed from CoTaZr. Of course, the nature or makeup of the particular film portion 32, 34, 36 may include different ferromagnetic materials than those mentioned above. While three such segments or portions are illustrated in FIG. 3 it should be understood that there may be two or more segments or portions. Still referring to FIG. 3, separate microstrip antennas 50a, 50b, 50c are disposed on the upper surface of the insulator 40 above the respective portions 32, 24, 36 of the ferromagnetic film 30. In this regard, a single frequency conversion device 10 may provide a multitude of frequency responses based on the different underlying ferromagnetic material beneath the respective microstrip antennas 50a, 50b, 50c. Further, in the embodiment illustrated in FIG. 3, the various thicknesses and dimensions discussed above with respect to the device 10 of FIG. 2 also apply.

Figure 4:
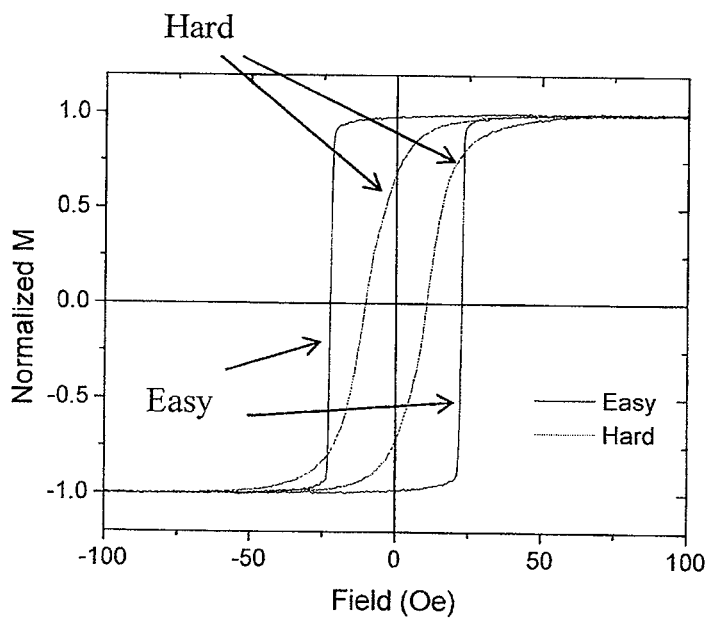
FIG. 4 illustrates a magnetization curve of a CoFe ferromagnetic film in both the soft and hard directions. The MH loops are similar for NiFe.

FIG. 4 illustrates a magnetization curve of a ferromagnetic film 30 in both the soft and hard directions. As stated above, the ferromagnetic film 30 is the non-linear element of the frequency conversion device 10. The non-liner response of the normalized magnetization (M) as a function of field strength (Oe) is illustrated for both the soft and hard directions. The passive ferromagnetic film 30 in the frequency conversion device 10 is what produces the frequency-to-frequency conversion.

Figure 1:
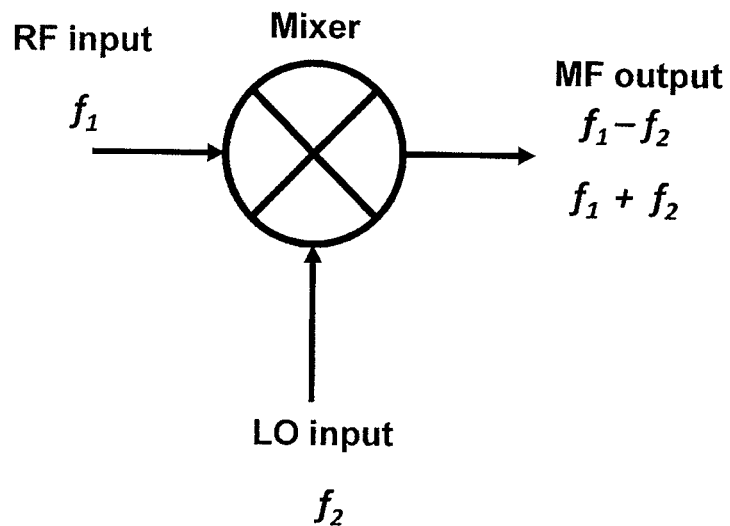
FIG. 1 illustrates a schematic representation of an ideal frequency mixer according to the prior art.

In an ideal mixer, such as that illustrated in FIG. 1, if the RF input and the LO input are sinusoids, the "ideal" mixer output is the sum and difference frequencies given by (where $A_1$ and $A_2$ represent the amplitudes of the input and LO (local oscillator) of frequencies $f_1$ and $f_2$, respectively):

$$A_{out} = [A_1 \cos(f_1 t)][A_2 \cos(f_2 t)] \qquad \text{Eq. 1}$$
$$= \frac{A_1 A_2}{2} [\cos(f_1 - f_2)t + \cos(f_1 + f_2)t]$$

In general, non-linear magnetization can be expressed as follows:

$$M = \chi H \cong \chi^{(1)} H + \chi^{(2)} H^2 + \chi^{(3)} H^3 + \ldots \quad \text{Eq. 2}$$

Where M is the magnetization of the ferromagnetic film 30, H is the external magnetic field, and X is the material's magnetic susceptibility. Assuming the RF input and LO input signals to the frequency conversion device 10 are sinusoids, the input magnetic field is given by:

$$H = H_{RF} \cos(f_1 t) + H_{LO} \cos(f_2 t) \quad \text{Eq. 3}$$

Substituting Equation (3) into Equation (2) above, one can find the output signal on the mixed frequencies of $2f_2-f_1$, $2f_1$, $f_1+f_2$, $2f_2$, $2f_1-f_2$, and $f_1-f_2$ which is similar to conventional non-linear mixers.

Figure 5:
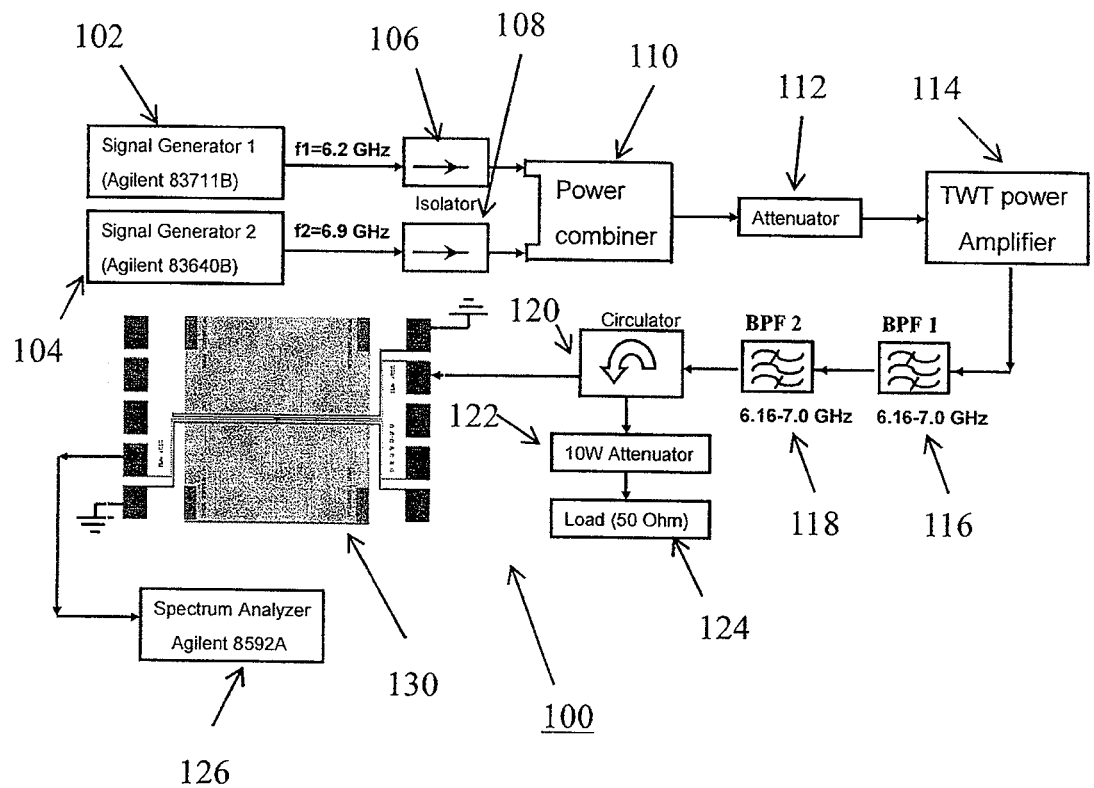
FIG. 5 illustrates an experimental setup for measuring the detected spectrum of a ferromagnetic-based frequency conversion device.

FIG. 5 illustrates an experimental setup 100 for measuring the detected spectrum of a ferromagnetic-based frequency conversion device 130. As seen in FIG. 5, two continuous signals at 6.2 GHz and 6.9 GHz were generated by first and second signal generators 102, 104. The first signal generator 102 was an Agilent 83711B signal generator while the second signal generator 104 was an Agilent 83640B signal generator. The respective signals from the first and second generators 102, 104 wherein then run through isolators 106, 108 and through a power combiner 110. The signal was attenuated via an attenuator 112 and subject to amplification in the travelling wave tube (TWT) power amplifier 114. The amplified signal was then passed through two bandpass filters 116, 118. The high-frequency bandpass filters 116, 118 (6.16-7.0 GHz bandpass window) were used to cutoff mixed frequencies produced by the TWT power amplifier 114. The signal was then passed through a circulator 120 coupled to a 10 W attenuator 122 under a load 124 of 50Ω. The circulator 120 is used for input/output isolation.

Figure 6:
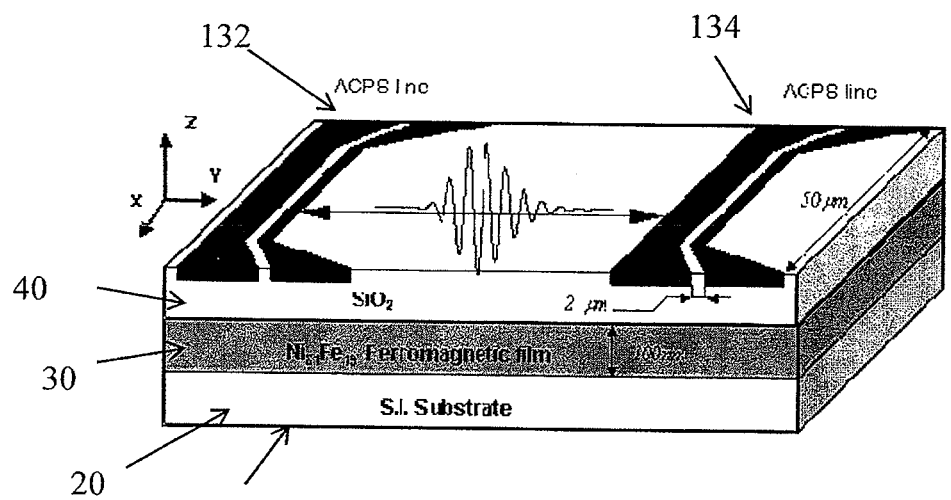
FIG. 6 illustrates a perspective view of the frequency conversion device used in the experimental setup of FIG. 5.

Still referring to FIG. 5, signal was then passed to a frequency conversion device 130. Unlike the frequency conversion device 10 illustrated in FIG. 2, this frequency conversion device 130 included two (2) microstrip antennas 132, 134 disposed atop the insulator 40 as illustrated in FIG. 6. Each microstrip antenna 132, 134 was formed as an asymmetric coplanar stripline antenna. The conductors forming each microstrip antenna 132, 134 were separated by a distance of around 2 μm. The ferromagnetic film 30 that was used was a 100 nm NiFe film. The width of the frequency conversion device 130 was around 50 μm. The ferromagnetic film 30 was disposed atop a silicon substrate 20. Signals were applied and measurements were obtained at room temperature. The output signal from the frequency conversion device 130 was detected using an Agilent 8592A spectrum analyzer 126.

Figure 7:
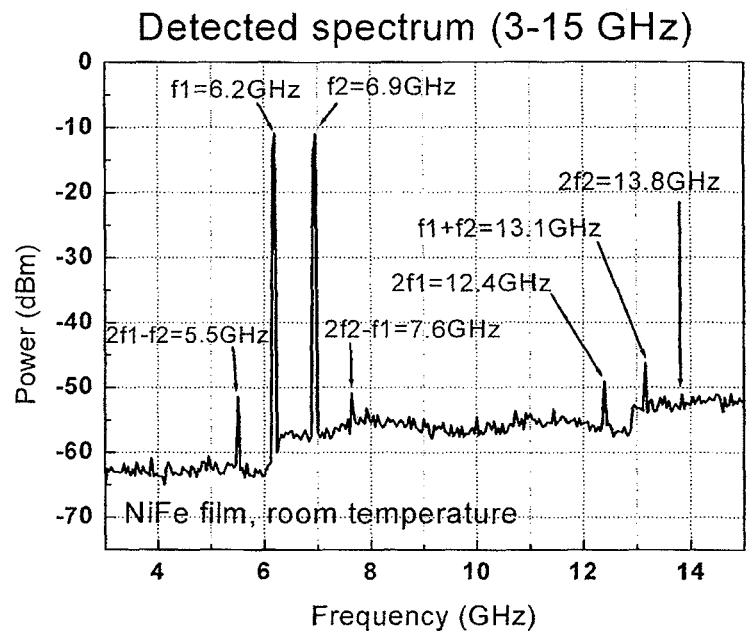
FIG. 7 illustrates the detected spectrum response of a ferromagnetic-based frequency conversion device (NiFe film) within the range of 3 to 15 GHz.
Figure 8:
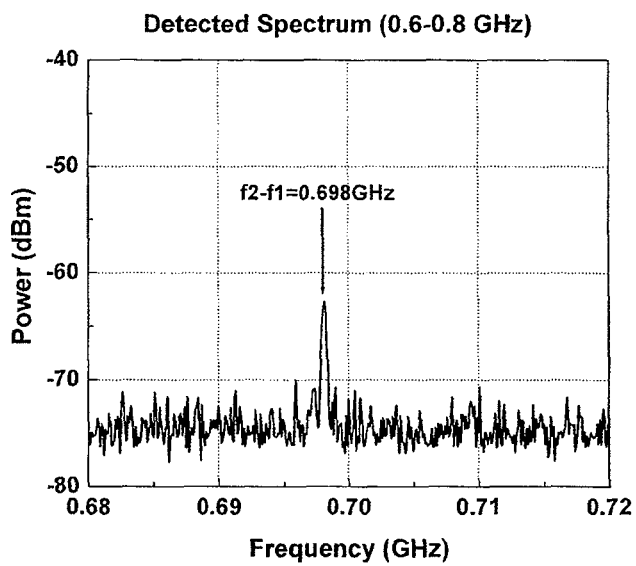
FIG. 8 illustrates the detected spectrum response of the same ferromagnetic-based frequency conversion device within the range of 0.6 to 0.8 GHz.

FIG. 7 illustrates the detected spectrum response of the device 130 within the range of 3 to 15 GHz. The power (dBm) of the detected signal is plotted as a function of frequency. As seen in FIG. 7, frequency conversion was observed where the output spectrum contains the mixed frequencies of the two input frequencies $f_1$ (6.2 GHz), $f_2$ (6.9 GHz). The two most prominent frequency responses (about −11 dBm) correspond to the excitation frequencies $f_1$ (6.2 GHz), $f_2$ (6.9 GHz). Lower power signals were observed also observed at of $2f_2-f_1$ (7.6 GHz), $2f_1$ (12.4 GHz), $f_1+f_2$ (13.1 GHz), $2f_2$ (13.8 GHz), $2f_1-f_2$ (5.5 GHz). FIG. 8 illustrates the detected spectrum response of the same ferromagnetic-based frequency conversion device 130 within the range of 0.6 to 0.8 GHz. In FIG. 8 the signal at $f_1-f_2$ (0.698 GHz) can be seen.

It should be understood that the frequency conversion devices 10, 130 are compatible with existing, traditional silicon-based technology which means that the device 10, 130 may be incorporated into conventional RF circuitry. For example, as one illustrative example, the frequency conversion device 10, 130 may be used in personal communication devices such as mobile phones for signal mixing and amplification. The frequency conversion device 10, 130 can be scaled down to relatively small dimensions (thickness on the order of hundreds of nanometers and micron areas). Further, because the frequency conversion device 10, 130 is not limited by the internal delays inherent in electronic-based devices, high frequency operations in the GHz and THz are possible. Fundamentally, the operation of the frequency conversion device 10, 130 is limited only by the spin relaxation time in the ferromagnetic layer 30 (which is picoseconds at room temperature). Further, power consumption is low because there are no electric-current-based non-linear components in the device 10, 130. Because of this, the frequency conversion devices 10, 130 described herein may consume less power than electronic-based mixers.

Another potential application of the frequency conversion devices 10, 130 relates to their use in data encryption applications. For instance, assume that different frequency conversion devices 10 all operate by receiving RF signals ($f_1$) on a publicly accessible frequency or channel. The different frequency conversion devices 10 may each be assigned different LO input frequencies ($f_2$). Each user of a particular different frequency conversion device 10 can share a common public RF frequency or channel while at the same time each user has his or her personal "private" LO input frequency key. In one aspect of the invention, the LO input frequency may be individually adjusted. Thus, a number of users can operate on a common public RF frequency or channel while users can decode information on a private, personal LO frequency key. Different LO input frequencies ($f_2$) will produce different mixed frequencies which can then be selected and processed (e.g., amplified or additional performing signal processing).

While embodiments of the present invention have been shown and described, various modifications may be made without departing from the scope of the present invention. The invention, therefore, should not be limited, except to the following claims, and their equivalents.

What is claimed is:

1. A frequency conversion device comprising:
    a substrate;
    a plurality of ferromagnetic film segments disposed over a surface of the substrate at different locations, each of the plurality of ferromagnetic segments comprising a different ferromagnetic material;
    an insulator disposed over the plurality of ferromagnetic film segments; and
    at least one microstrip antenna disposed over the insulator at a location above each of the plurality of ferromagnetic film segments.

2. The device of claim 1, wherein at least one of the ferromagnetic film segments comprises NiFe.

3. The device of claim 1, wherein at least one of the ferromagnetic film segments comprises CoFe.

4. The device of claim 1, wherein at least one of the ferromagnetic film segments comprises CoTaZr.

5. The device of claim 1, wherein the thickness of the plurality of ferromagnetic film is within the range of about 10 nm to about 500 nm.

6. The device of claim 1, wherein the thickness of the insulator is within the range of about 10 nm to about 500 nm.

7. The device of claim 1, further comprising circuitry configured to (a) apply an input frequency to the microstrip antennas and (b) detect a mixed output frequency from the microstrip antennas in response to an applied radiofrequency.

8. The device of claim 1, further comprising a plurality of microstrip antennas disposed over the insulator at a location above each of the plurality of ferromagnetic film segments.

9. The device of claim 1, wherein the at least one microstrip antenna comprises an asymmetric coplanar stripline antenna.

10. The device of claim 1, wherein the device is configured to receive a first input frequency comprising a public radiofrequency and a second input frequency comprising a non-public LO input frequency.

11. The device of claim 10, wherein the non-public LO input frequency is adjustable.

12. The device of claim 1, wherein the device is configured to operate in at high frequencies in the GHz and THz range.

13. A frequency conversion device comprising:
   a substrate;
   a ferromagnetic film of a first type disposed over a surface of the substrate;
   a ferromagnetic film of a second type disposed over the surface of the substrate;
   an insulator disposed over the ferromagnetic film of the first type and of the second type;
   a first microstrip antenna disposed over the insulator at a location above the ferromagnetic film of the first type; and
   a second microstrip antenna disposed over the insulator at a location above the ferromagnetic film of the second type.

14. The device of claim 13, wherein the ferromagnetic films of the first and second type are selected from the group consisting of NiFe, CoFe, and CoTaZr.

15. The device of claim 14, wherein the thickness of the ferromagnetic films of the first and second type is within the range of about 10 nm to about 500 nm.

16. The device of claim 15, wherein the thickness of the insulator is within the range of about 10 nm to about 500 nm.

17. The device of claim 13, further comprising circuitry configured to (a) apply an input frequency to the first and second microstrip antennas and (b) detect a mixed output frequencies from the first and second microstrip antennas in response to an applied radiofrequency.

18. The device of claim 17, wherein the device is configured to receive a first input frequency comprising a public radiofrequency and a second input frequency comprising a non-public LO input frequency.

19. The device of claim 18, wherein the non-public LO input frequency is adjustable.

20. The device of claim 13, wherein the device is configured to operate in at high frequencies in the GHz and THz range.

* * * * *